United States Patent [19]
Park

[11] Patent Number: 5,492,849
[45] Date of Patent: Feb. 20, 1996

[54] METHOD OF FORMING A CAPACITOR IN A SEMICONDUCTOR DEVICE

[75] Inventor: Sang H. Park, Kyungki-Do, Rep. of Korea

[73] Assignee: Hyundai Electronics Industries Co., Ltd., Kyungki-Do, Rep. of Korea

[21] Appl. No.: 364,302

[22] Filed: Dec. 27, 1994

[30] Foreign Application Priority Data

Dec. 27, 1993 [KR] Rep. of Korea ................. 93-29814
Dec. 27, 1993 [KR] Rep. of Korea ................. 93-29815
Dec. 27, 1993 [KR] Rep. of Korea ................. 93-29816

[51] Int. Cl.⁶ ............................................. H01L 21/8242
[52] U.S. Cl. ..................... 437/52; 437/60; 437/919; 437/233
[58] Field of Search ........................ 437/47, 48, 52, 437/60, 233, 919; 257/306, 307

[56] References Cited

U.S. PATENT DOCUMENTS

| | | |
|---|---|---|
| 5,126,916 | 6/1992 | Tseng ................................. 437/60 |
| 5,164,337 | 11/1992 | Ogawa et al. ..................... 437/919 |
| 5,192,702 | 3/1993 | Tseng ................................. 437/47 |
| 5,219,780 | 6/1993 | Jun .................................... 437/60 |
| 5,268,322 | 12/1993 | Lee et al. .......................... 437/60 |
| 5,273,925 | 12/1993 | Yamanaka ......................... 437/60 |
| 5,326,714 | 7/1994 | Liu et al. ........................... 437/60 |
| 5,380,673 | 1/1995 | Yang et al. ........................ 437/60 |
| 5,403,767 | 4/1995 | Kim .................................... 437/60 |

*Primary Examiner*—Tom Thomas
*Attorney, Agent, or Firm*—Fish & Richardson

[57] ABSTRACT

A method of forming a capacitor in a semiconductor device is disclosed. A charge storage electrode is formed with a third polysilicon layer connected to a fourth polysilicon layer. A dielectric layer is formed with a first dielectric layer connected to a second dielectric layer. A plate electrode is formed by connecting the first polysilicon layer to the sixth polysilicon layer. The first polysilicon layer is formed under the third polysilicon layer. The first dielectric layer is formed between the first polysilicon layer and the third polysilicon layer.

45 Claims, 9 Drawing Sheets

5,492,849

METHOD OF FORMING A CAPACITOR IN A SEMICONDUCTOR DEVICE

FIELD OF THE INVENTION

This invention relates to a method of forming a capacitor in a semiconductor device, and more particularly to a method of forming a stacked capacitor in a semiconductor device that can increase the capacitance of a stacked capacitor by forming a dielectric layer and a plate electrode above and below a charge storage electrode.

INFORMATION DISCLOSURE STATEMENT

In a conventional stacked capacitor, a dielectric layer is formed only on the upper portion and the side portion of a charge storage electrode, and a plate electrode is then formed on the dielectric layer. Since such a stacked capacitor must be raised to the height of the capacitor to obtain the capacitance necessary for operating as a memory device, it is difficult to accomplish high integration or minimization of a semiconductor device. Also, if the height of the capacitor increases, the topology becomes very large due to the continuity of various processes, making it difficult to form a metal wire.

SUMMARY OF THE INVENTION

Therefore, it is the object of the present invention to provide a method of forming a stacked capacitor in a semiconductor device that can increase the capacitance of a stacked capacitor within a limited chip area by forming a dielectric layer and a plate electrode under and over a charge storage electrode.

To accomplish the above object, a method of forming a capacitor in a semiconductor device according to the present invention, comprising the steps of:

sequentially forming a an insulating layer and a first polysilicon layer on a silicon substrate having an impurity region; etching a portion of the first polysilicon layer to expose a portion of the insulating layer; sequentially depositing a first dielectric layer and a second polysilicon layer on the first polysilicon layer including the insulating layer; etching a portion of the first dielectric layer, the second polysilicon layer, and the insulating layer to expose the impurity region, thereby forming a contact hole; forming a third polysilicon layer on the entire surface of the resulting structure after forming the contact hole and the second polysilicon layer; patterning the second and third polysilicon layer to expose portions of the first dielectric layer; depositing a CVD oxide layer on the entire surface of the resulting structure after patterning the second and third polysilicon layers; etching a portion of the CVD oxide layer to expose the third polysilicon layer, thereby forming an groove; depositing a fourth polysilicon layer on the entire surface of the resulting structure after forming the groove and filling the groove with a photoresist; sequentially removing an exposed portion of the fourth polysilicon layer, the CVD oxide layer, and the first dielectric layer, and removing the photoresist; sequentially depositing a second dielectric layer and a fifth polysilicon layer on the entire surface of the resulting structure after removing the photoresist, and etching the side portions of the fifth polysilicon layer and the second dielectric layer to expose the first polysilicon layer; and depositing a sixth polysilicon layer on the entire surface of the resulting structure after etching the first polysilicon layer and the second dielectric layer.

A method of forming a capacitor in a semiconductor device according to a first embodiment of the present invention, comprising the steps of:

sequentially forming an insulating layer and a first polysilicon layer on a silicon substrate having an impurity region; etching a portion of the first polysilicon layer to expose a portion of the insulating layer; sequentially depositing a first dielectric layer and a second polysilicon layer on the first polysilicon layer including the insulating layer; etching a portion of the first dielectric layer, the second polysilicon layer, and the insulating layer to expose the impurity region, thereby forming a contact hole; depositing a third polysilicon layer on the entire surface of the resulting structure after forming and the contact hole; depositing a CVD oxide layer on the third polysilicon layer and patterning the CVD oxide layer to remain a portion of the CVD oxide layer at the center of the third polysilicon layer; depositing a fourth polysilicon layer on the entire surface of the resulting structure after patterning the CVD oxide layer; forming a photoresist pattern on the fourth polysilicon layer to expose a first, second and third side portions of the fourth polysilicon layer; removing the third polysilicon layer, the fourth polysilicon layer, the CVD oxide layer and the first dielectric layer, exposed by the photoresist pattern; removing the photoresist pattern and sequentially depositing a second dielectric layer and a fifth polysilicon layer on the entire surface of the resulting structure after removing the photoresist; etching portions of the fifth polysilicon layer and the second dielectric layer to expose the first polysilicon layer; and depositing a sixth polysilicon layer on the entire surface of the resulting structure after etching the fifth polysilicon layer and the second dielectric layer.

A method of forming a capacitor in a semiconductor device according to a second embodiment of the present invention, comprising the steps of:

sequentially forming an insulating layer and a first polysilicon layer on a silicon substrate having an impurity region; etching a portion of the first polysilicon layer to expose a portion of the insulating layer; sequentially depositing a first dielectric layer and a second polysilicon layer on the first polysilicon layer including the insulating layer; etching a portion of the first dielectric layer, the second polysilicon layer, and the insulating layer to a desired width to expose the impurity region, thereby forming a contact hole; depositing a third polysilicon layer on the entire surface of the resulting structure after forming the contact hole; depositing a CVD oxide layer on the third polysilicon layer and patterning the CVD oxide layer to remain a portion of the CVD oxide layer at the center of the third polysilicon layer; depositing a fourth polysilicon layer on the entire surface of the resulting structure after patterning the CVD oxide layer, and etching the third and fourth polysilicon layers exposed by patterning the CVD oxide layer to be expose the first dielectric layer, thereby forming a fourth polysilicon spacer on the side walls of the CVD oxide layer; removing the first dielectric layer exposed by etching the third and fourth polysilicon layers to expose the first polysilicon layer and thereafter removing the CVD oxide layer; sequentially depositing a second dielectric layer and a fifth polysilicon layer on the entire surface of the resulting structure after removing the CVD oxide layer, and etching the side portions of the fifth polysilicon layer and second dielectric layer to expose the first polysilicon layer; and depositing a sixth polysilicon layer on the entire surface of the resulting structure after the fifth polysilicon layer and the second dielectric layer.

BRIEF DESCRIPTION OF THE DRAWINGS

To better understand the nature and the object of the present invention, reference should be made to the following detailed descriptions of the accompanying drawings in which.

Similar reference characters refer to similar parts through the several views of the drawings.

DETAILED DESCRIPTION OF THE INVENTION

FIG. 1A through FIG. 1F illustrate cross-sectional views showing the processes of a stacked capacitor according to the present invention.

Figure 1A:
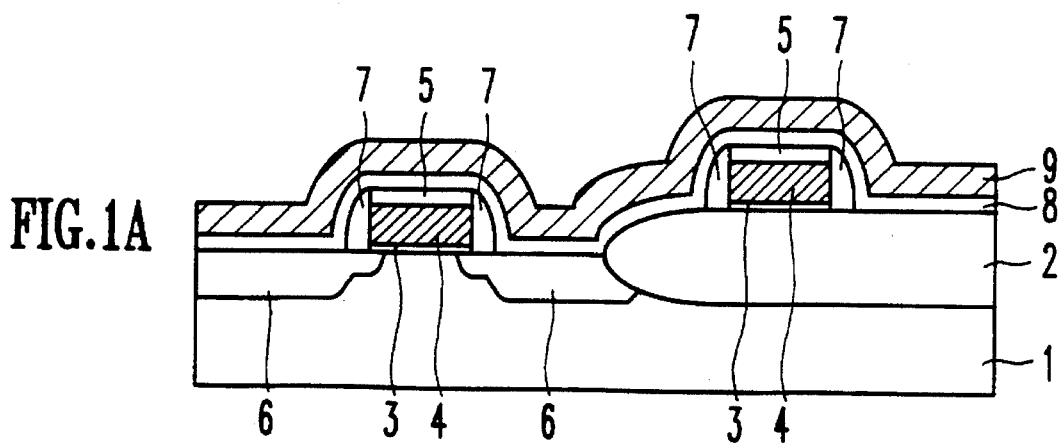
FIG. 1A through FIG. 1F illustrate processes of forming a stacked capacitor according to the present invention.

Referring to FIG. 1A, a field oxide layer 2, a gate oxide layer 3, a gate electrode layer 4, an oxide layer 5, an impurity region 6 and an oxide spacer 7 are sequentially formed on a silicon substrate 1, thereby forming a transistor. An insulating layer 8 and a first polysilicon layer 9 are then sequentially formed on the resulting structure after forming the transistor. The first polysilicon layer 9 is formed with doped polysilicon in which an impurity is doped. The insulating layer 8 is formed with nitride.

Figure 1B:
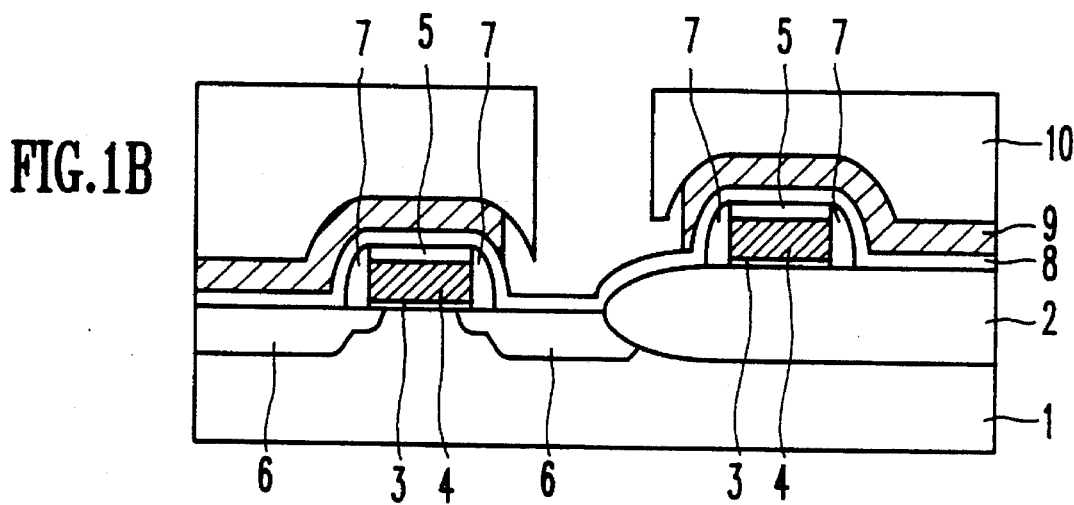

Referring to FIG. 1B, a first photoresist 10 is coated on the first polysilicon layer 9 and a portion of the first photoresist is removed by a lithography process using a mask so that a portion of the first polysilicon layer 9, on which a contact hole will be formed, is exposed, thereby forming a first photoresist pattern. The first polysilicon layer 9 exposed by the first photoresist pattern is etched by a dry-etching process to form an undercut A. At this stage, the insulating layer 8 acts as an etching barrier.

Figure 1C:
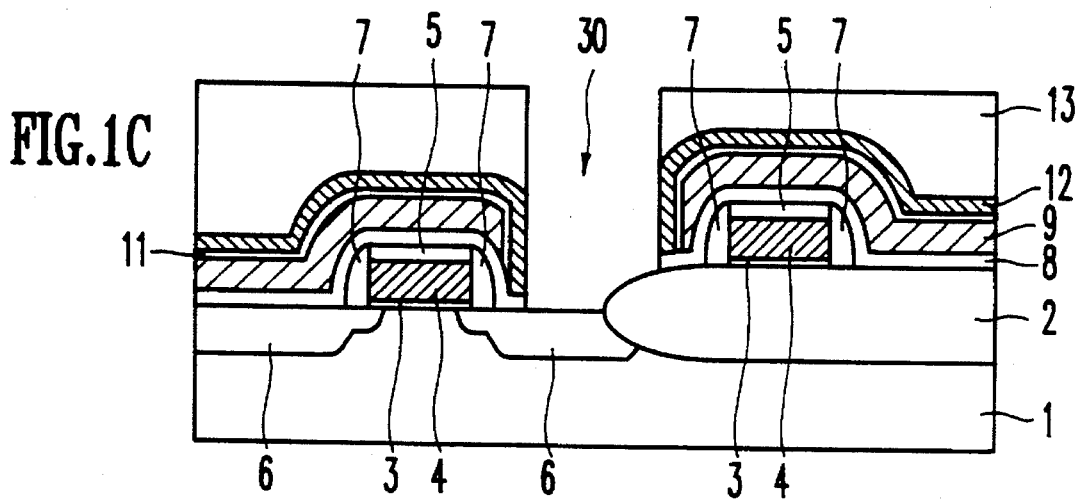

Referring to FIG. 1C, the first photoresist 10 is removed, and a first dielectric layer 11 is then formed on the entire surface of the resulting structure after etching the first polysilicon layer 9. A second polysilicon layer 12 is formed on the first dielectric layer 11 and a second photoresist 13 is then coated on the second polysilicon layer 12. A portion of the second photoresist 13 is removed by a lithography process using a contact mask for a charge storage electrode so that a portion of the second polysilicon layer 12 is exposed, thereby forming a second photoresist pattern. The second polysilicon layer 12, the first dielectric layer 11 and the insulating layer 8 exposed sequentially by the second photoresist pattern are etched by an etching process, thereby forming a contact hole 30. The second polysilicon layer 12 is formed with a thickness of 100 to 500Å to protect against damage to the first dielectric layer 11 due to the continuity of various processes. Also, the second polysilicon layer 12 is formed with undoped polysilicon on which an impurity is not doped. The second photoresist pattern may be formed utilizing the mask used in forming the first photoresist pattern.

Figure 1D:
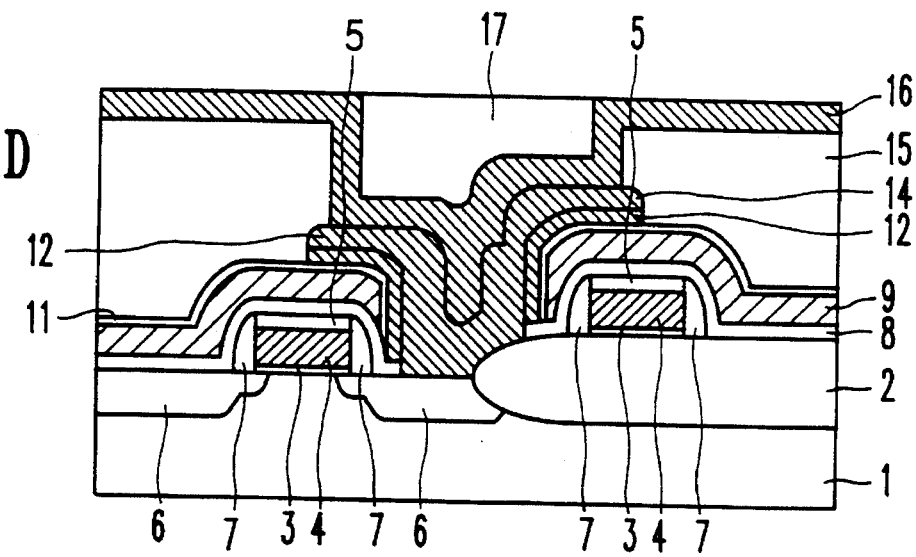

Referring to FIG. 1D, the second photoresist 13 is removed and a third polysilicon 14 is then formed on the surface of the resulting structure after forming the contact hole 30. A portion of the third polysilicon layer 14 and second polysilicon layer 12 is etched by a lithography process and an etching process, thereby patterning the third polysilicon layer 14 and the second polysilicon layer 12. A CVD oxide layer 15 is deposited on the surface of the resulting structure after etching the third polysilicon layer 14 and the second polysilicon layer 12. A portion of the CVD oxide layer 15 is etched by a lithography process and an anisotropic etching process to expose the third polysilicon layer 14 patterned by a lithography process and an etching process, thereby forming a groove. A fourth polysilicon layer 16 is deposited on the surface of the resulting structure after forming the groove. The groove is completely filled with a third photoresist 17. The first dielectric layer 11 acts as an etching barrier while a portion of the third polysilicon layer 14 and second polysilicon layer 12 is etched. The groove may be filled with a spin on glass(SOG). The third polysilicon layer 14 and the fourth polysilicon layer 16 are formed with doped polysilicon in which an impurity is doped. Also, the third polysilicon layer 14 and the fourth polysilicon layer 16 act as charge storage electrodes for the capacitor.

Figure 1E:
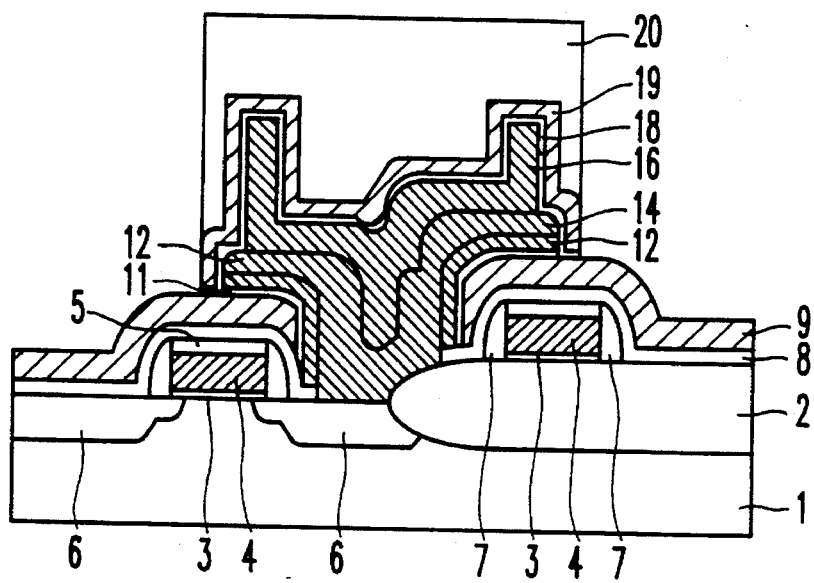

Referring to FIG. 1E, an exposed portion of the fourth polysilicon layer 16, the CVD oxide layer 15 and the first dielectric layer 11 are sequentially etched by an etching process using the third photoresist 17 as a mask and the third photoresist 17 is then removed. A second dielectric layer 18 is formed on the surface of the resulting structure after removing the third photoresist 17. Therefore the second dielectric layer 18 is connected to the first dielectric layer 11. A fifth polysilicon layer 19 is formed on the second dielectric layer 18 and a fourth photoresist 20 is then coated on the fifth polysilicon layer 19. The fourth photoresist 20 is patterned by a lithography process to cover the center portion of the fifth polysilicon layer 19. An exposed portion of the fifth polysilicon layer 19 and second dielectric layer 18 are sequentially etched by an etching process using the fourth photoresist 20 patterned by a lithography process to expose the first polysilicon layer 9. The fifth polysilicon layer 19 is deposited with a thickness of 100 to 500Å to protect against damage to the second dielectric layer 18 due to the continuity of various processes. Also, the fifth polysilicon layer 19 is formed with undoped polysilicon in which an impurity is not doped and the CVD oxide layer 15 is preferably removed by an isotropic etching process.

Figure 1F:
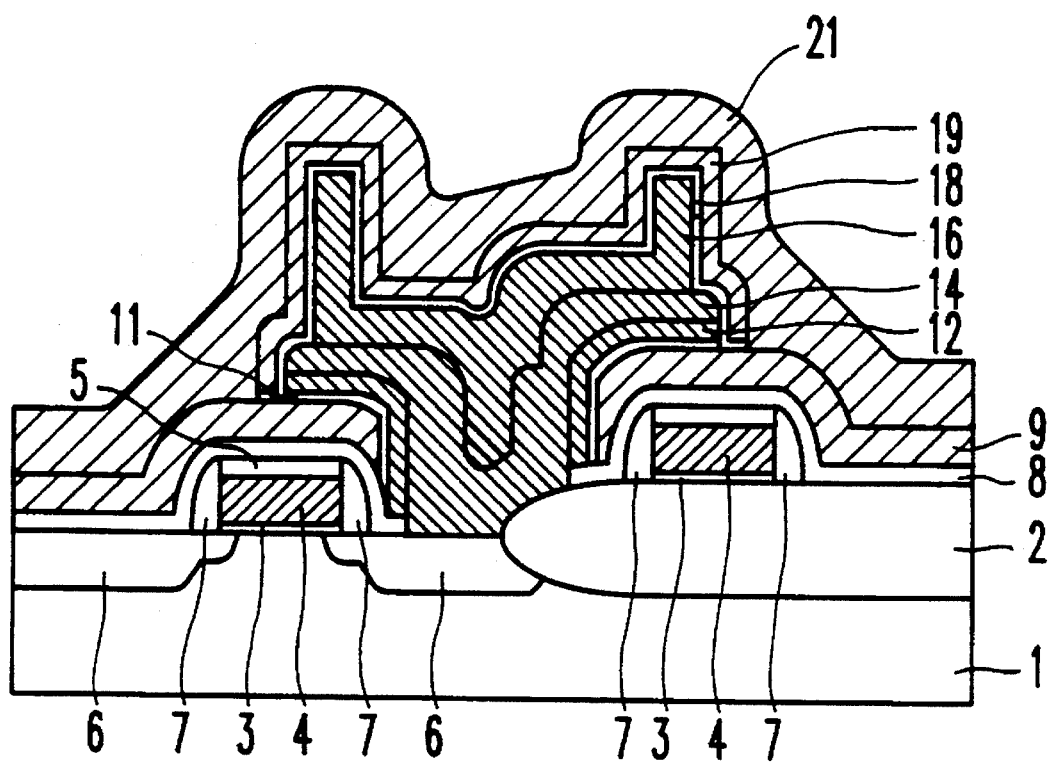

Referring to FIG. 1F, the fourth photoresist 20 is removed and a sixth polysilicon layer 21 is then deposited on the entire surface of the resulting structure after removing the fourth photoresist 20 thereby forming a capacitor. The sixth polysilicon layer 21 is formed with doped polysilicon in which an impurity is doped. Also, the sixth polysilicon layer 21 connected to the first polysilicon layer 9 acts as a plate electrode for the capacitor.

Figure 2A:
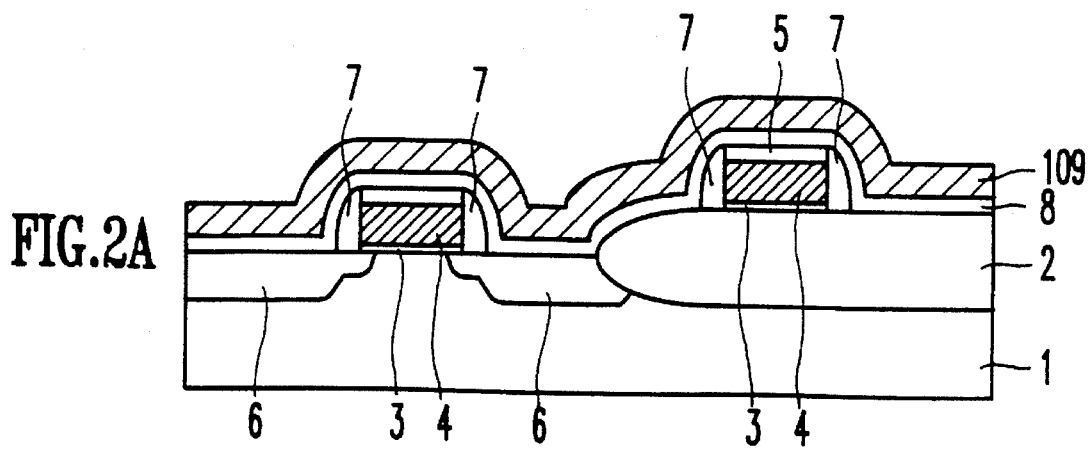
FIG. 2A through FIG. 2F illustrate processes of forming a stacked capacitor according to the first embodiment of the present invention.

Referring to FIG. 2A, a field oxide layer 2, a gate oxide layer 3, a gate electrode layer 4, an oxide layer 5, an impurity region 6 and an oxide spacer 7 are sequentially formed on a silicon substrate 1, thereby forming a transistor. An insulating layer 8 and a first polysilicon layer 109 are then sequentially formed on the resulting structure after forming the transistor. The first polysilicon layer 109 is formed with doped polysilicon in which an impurity is doped. The insulating layer 8 is formed with nitride.

Figure 2B:
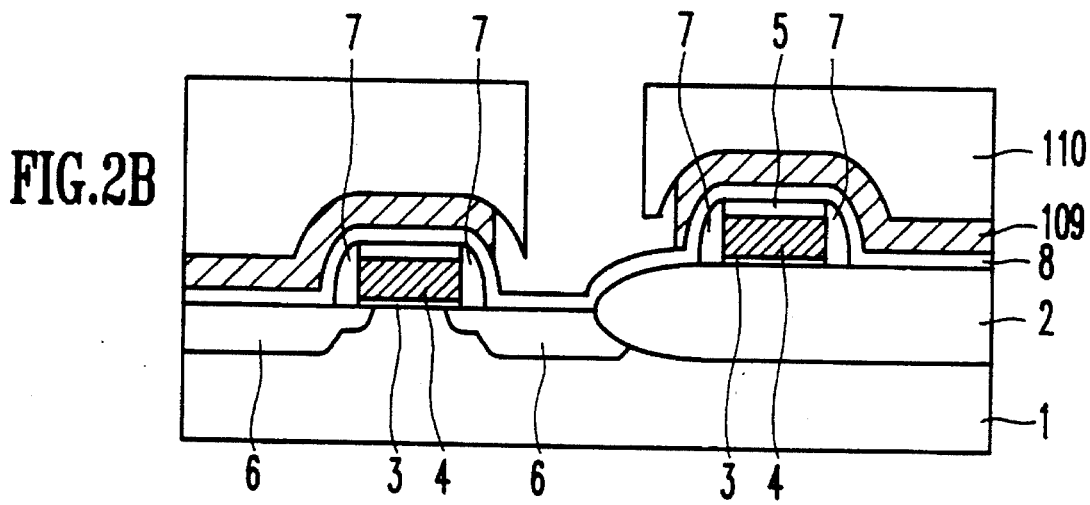

Referring to FIG. 2B, a first photoresist 110 is coated on the first polysilicon layer 109 and a portion of the first photoresist 110 is removed by a lithography process using a mask so that a portion of the first polysilicon layer 109, on which a contact hole will be formed, is exposed, thereby forming a first photoresist pattern. The first polysilicon layer 109 exposed by the first photoresist pattern is etched by a dry-etching process to form an undercut 8. At this stage, the insulating layer 8 acts as an etching barrier.

Figure 2C:
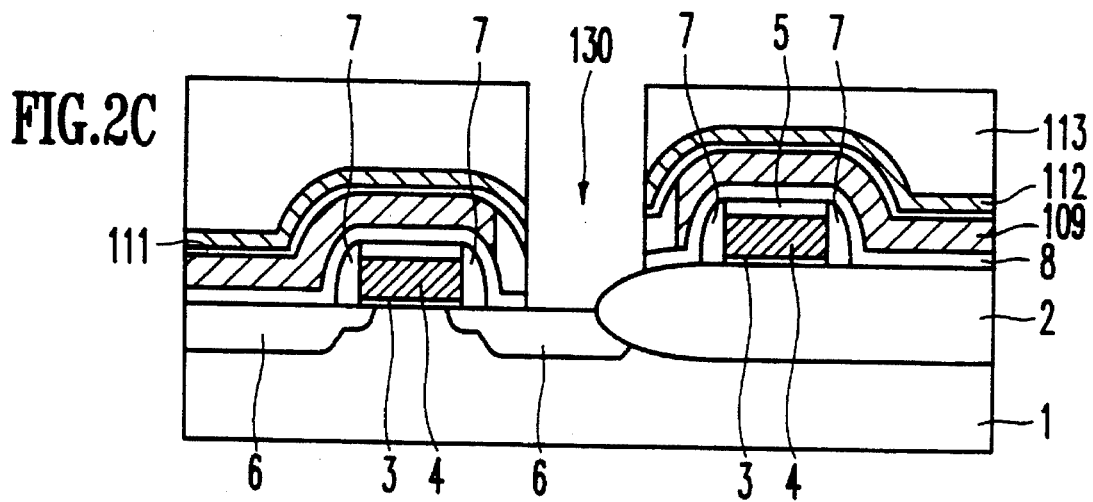

Referring to FIG. 2C, the first photoresist 110 is removed, and a first dielectric layer 111 is then formed on the entire surface of the resulting structure after removing the first photoresist 110. A second polysilicon layer 112 is formed on the first dielectric layer 111 and a second photoresist 113 is then coated on the second polysilicon layer 112. A portion of the second photoresist 113 is removed by a lithography process using a contact mask for a charge storage electrode so that a portion of the second polysilicon layer 112 is exposed, thereby forming a second photoresist pattern. The second polysilicon layer 112, the first dielectric layer 111 and the insulating layer 8 sequentially exposed by the second photoresist pattern are etched by an etching process, thereby forming a contact hole 130. The second polysilicon layer 112 is formed with a thickness of 100 to 500Å to protect against damage to the first dielectric layer 111 due to the continuity of various processes. Also, the second polysilicon layer is formed with undoped polysilicon in which an impurity is not doped. The second photoresist pattern may be formed utilizing the mask used in forming the first photoresist pattern.

Figure 2D:
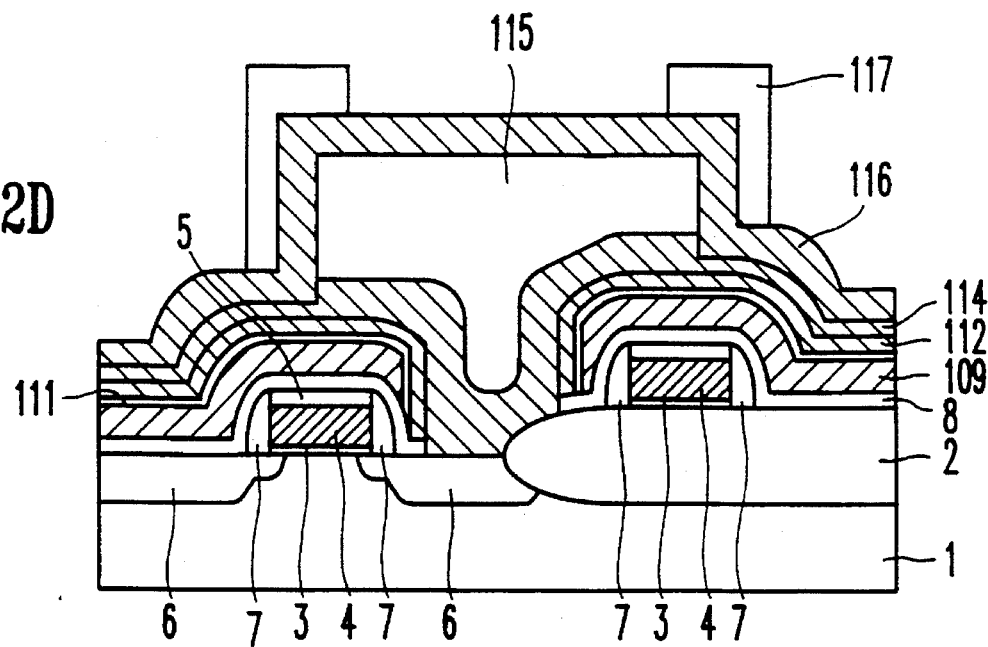

Referring to FIG. 2D, the second photoresist 113 is removed and a third polysilicon layer 114 is then deposited on the entire surface of the resulting structure after removing the second photoresist 113. A CVD oxide layer 115 is deposited on the third polysilicon layer 114. The CVD oxide layer 115 is patterned by a lithography process and an anisotropic etching process to keep it at the center of the third polysilicon layer 114. The third polysilicon layer 114 exposed by patterning the CVD oxide layer 115 is then etched until the third polysilicon layer 114 has a thickness of about 50 to 500Å. A fourth polysilicon layer 116 is deposited on the entire surface of the resulting structure after etching the third polysilicon layer 114. A third photoresist pattern 117 is formed on the fourth polysilicon layer 116 to expose a first, second and third portion 116a, 116b and 116c of the fourth polysilicon layer 116. The third polysilicon layer 114 and the fourth polysilicon layer 116 are formed with doped polysilicon in which an impurity is doped. Also, the third polysilicon layer 114 and the fourth polysilicon layer 116 act as a charge storage electrode for the capacitor.

Figure 2E:
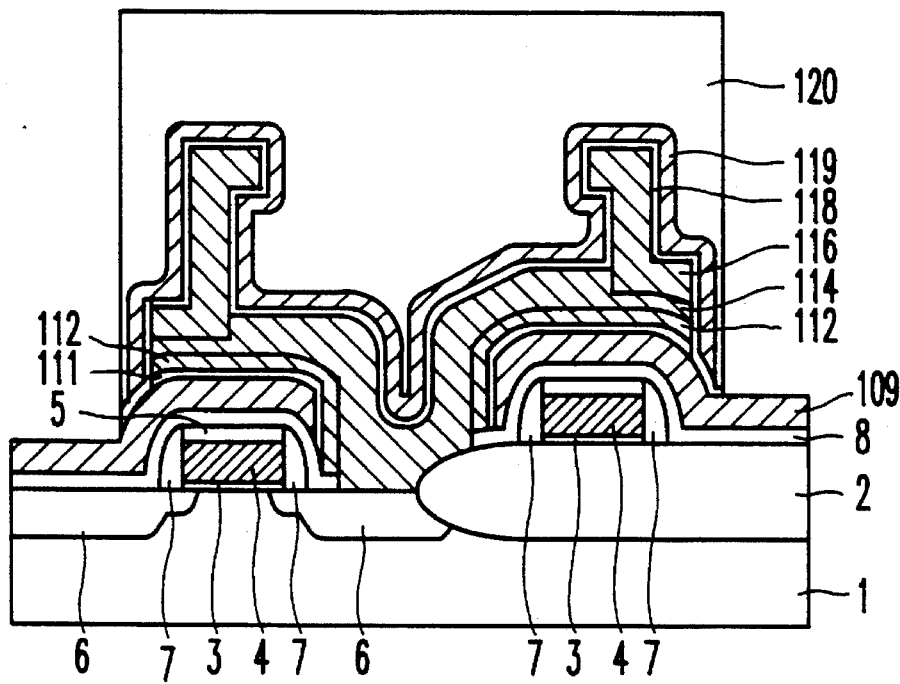

Referring to FIG. 2E, the third polysilicon layer 114, the fourth polysilicon layer 116, the CVD oxide layer 115 and the first dielectric layer 111, exposed by the third photoresist pattern 117, are sequentially removed to expose the first polysilicon layer 109 and the third photoresist pattern 117 is then removed. A second dielectric layer 118 is formed on the entire surface of the resulting structure after removing the third photoresist pattern 117 and a fifth polysilicon layer 119 is then the deposited on the second dielectric layer 118. A fourth photoresist pattern 120 is formed at the center of the fifth polysilicon layer 119 to expose portions of the fifth polysilicon layer 119. The fifth polysilicon layer 119 and the second dielectric layer 118, exposed by the fourth photoresist pattern 120, are sequentially etched by an etching process to expose the first polysilicon layer 109. The fifth polysilicon layer 119 is preferably formed with a thickness of about 100 to 500Å to protect against damage to the second dielectric layer 118 due to the continuity of various processes. Also, the fifth polysilicon layer 119 is formed with undoped polysilicon in which an impurity is not doped. It is desirable that the third polysilicon layer 114 and the fourth polysilicon layer 116 are removed by an anisotropic etching process using the first dielectric layer 111 as an etching barrier to protect against damage to the first polysilicon layer 109, while the CVD oxide layer 115 is preferably removed by an isotropic etching process.

Figure 2F:
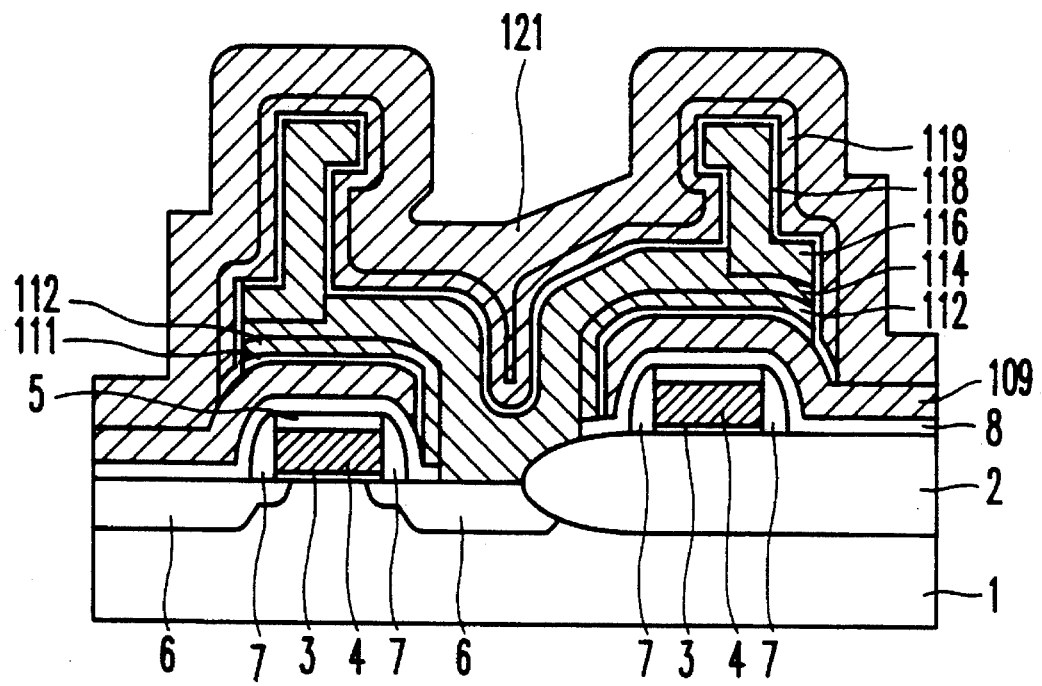

Referring to FIG. 2F, the fourth photoresist pattern 120 is removed and a sixth polysilicon layer 121 is then deposited on the entire surface of the resulting structure after depositing the sixth polysilicon layer 121 thereby forming a capacitor. The sixth polysilicon layer 121 is desirably formed with doped polysilicon in which an impurity is doped. Also, the sixth polysilicon layer 121 connected to the first polysilicon layer 109 acts as a plate electrode for the capacitor.

Figure 3A:
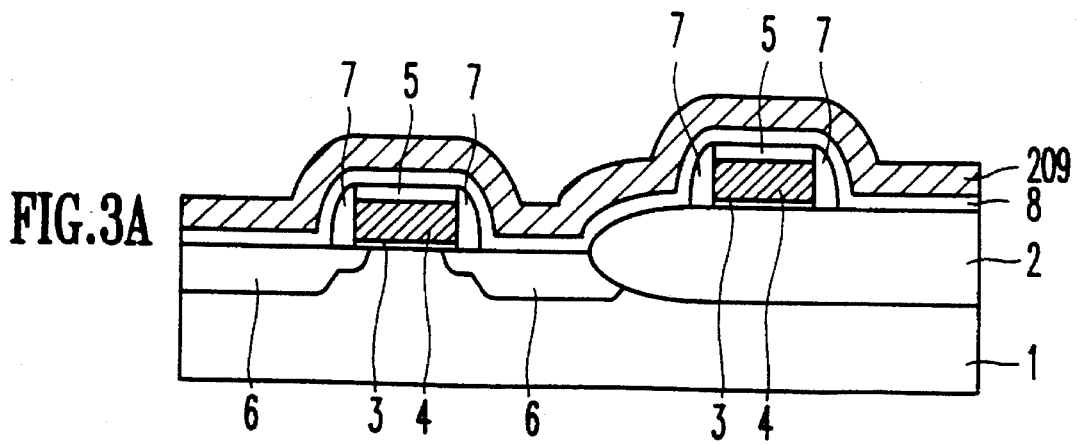
FIG. 3A through FIG. 3G illustrate processes of forming a stacked capacitor according to the second embodiment of the present invention.

Referring to FIG. 3A, a field oxide layer 2, a gate oxide layer 3, a gate electrode layer 4, an oxide layer 5, an impurity region 6 and an oxide spacer 7 are sequentially formed on a silicon substrate 1, thereby forming a transistor. An insulating layer 8 and a first polysilicon layer 209 are then sequentially formed on the resulting structure after forming on the transistor. The first polysilicon layer 209 is formed with doped polysilicon on which an impurity is doped. The insulating layer 8 is formed with nitride.

Figure 3B:
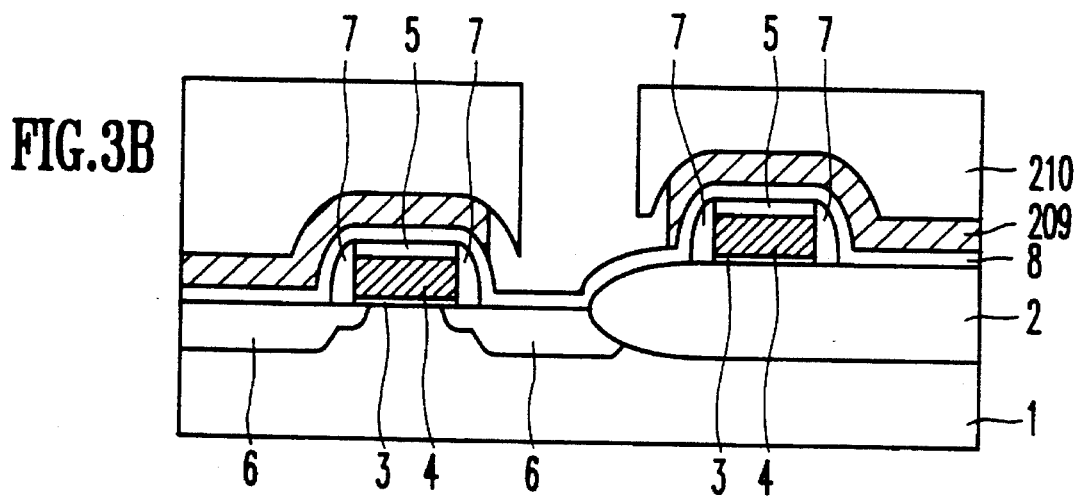

Referring to FIG. 3B, a first photoresist 210 is coated on the first polysilicon layer 209 and a portion of the first photoresist 210 is removed by a lithography process using a mask so that a portion of the first polysilicon layer 209, on which a contact hole will be formed, is exposed, thereby forming a first photoresist pattern. The first polysilicon layer 209 exposed by the first photoresist pattern is etched by a dryetching process to form an undercut C. At this stage, the insulating layer 8 acts as an etching barrier.

Figure 3C:
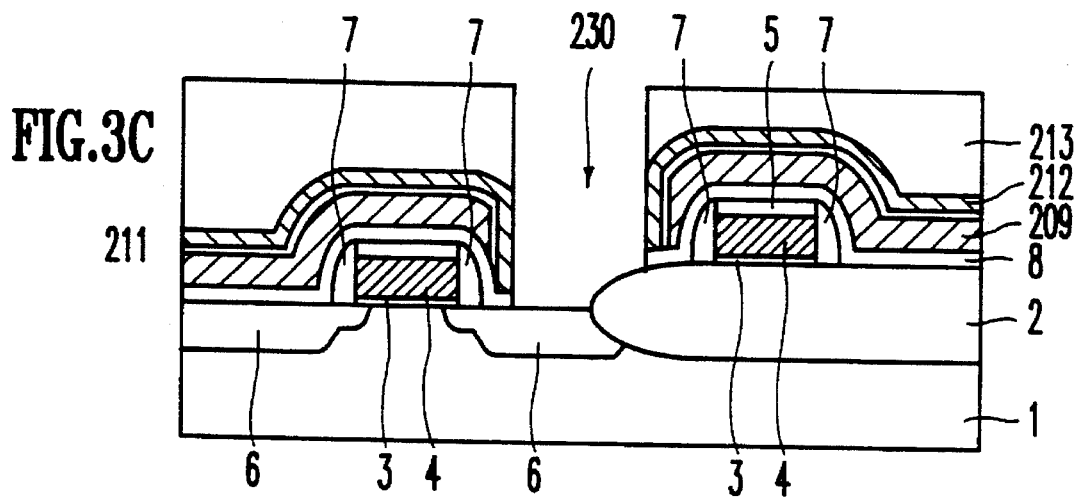

Referring to FIG. 3C, the first photoresist 210 is removed, and a first dielectric layer 211 is then formed on the entire surface of the resulting structure after removing the second photoresist 214. A second polysilicon layer 212 is formed on the first dielectric layer 211 and a second photoresist 213 is then coated on the second polysilicon layer 212. A portion of the second photoresist 213 is removed by a lithography process using a contact mask for a charge storage electrode so that a portion of the second polysilicon layer 212 is exposed, thereby forming a second photoresist pattern. The second polysilicon layer 212, the first dielectric layer 211 and the insulating layer 8 sequentially exposed by the second photoresist pattern are etched by an etching process, thereby forming a contact hole 230. The second polysilicon layer 212 is formed with a thickness of 100 to 500Å to protect against damage to the first electric layer 211 due to the continuity of various processes. Also, the second polysilicon layer 212 is formed with undoped polysilicon in which an impurity is not doped. The second photoresist pattern may be formed by the mask used in forming the first photoresist pattern.

Figure 3D:
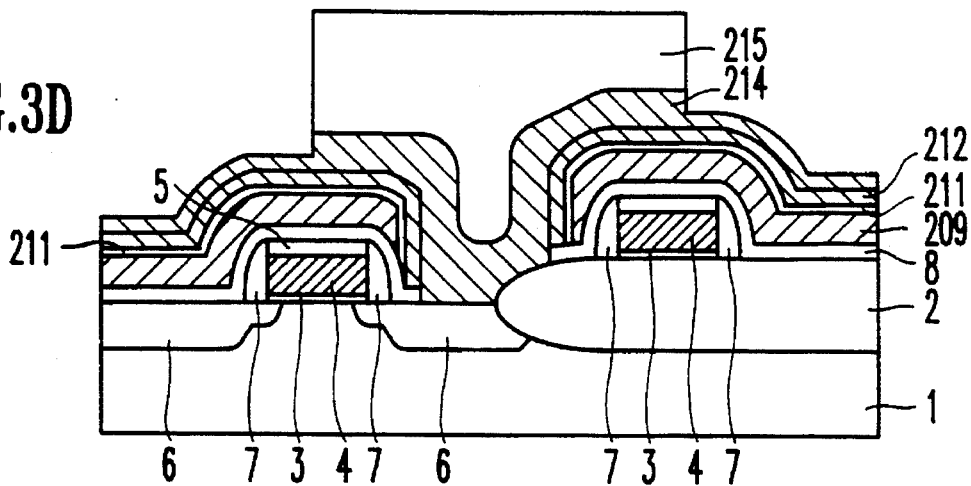

Referring to FIG. 3D, the second photoresist 213 is removed and a third polysilicon layer 214 is then deposited on the entire surface of the resulting structure after removing the second photoresist 214. A CVD oxide layer 215 is deposited on the third polysilicon layer 214. A portion of the CVD oxide layer 213 is patterned by a lithography process and an anisotropic etching process to keep it at the center of the third polysilicon layer 214. The third polysilicon layer 214 exposed by patterning the CVD oxide layer 215 is then etched until the third polysilicon layer 214 has a thickness of about 50 to 500Å.

Figure 3E:
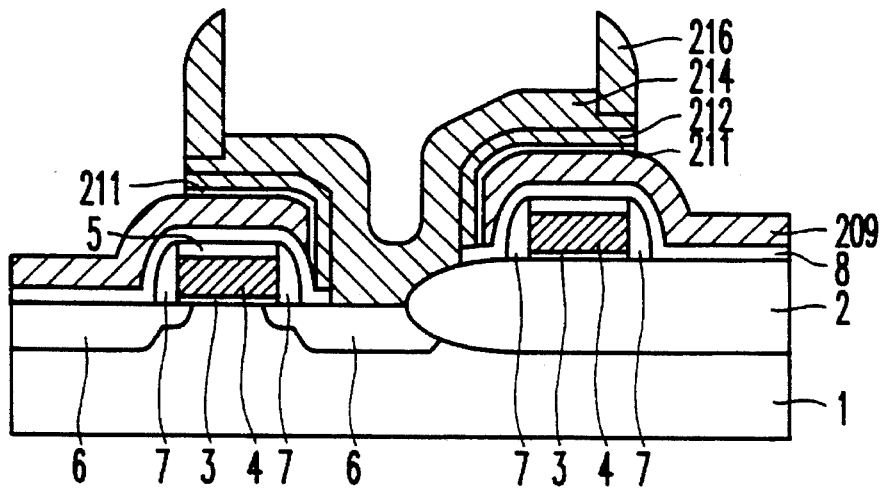
Figure 3F:
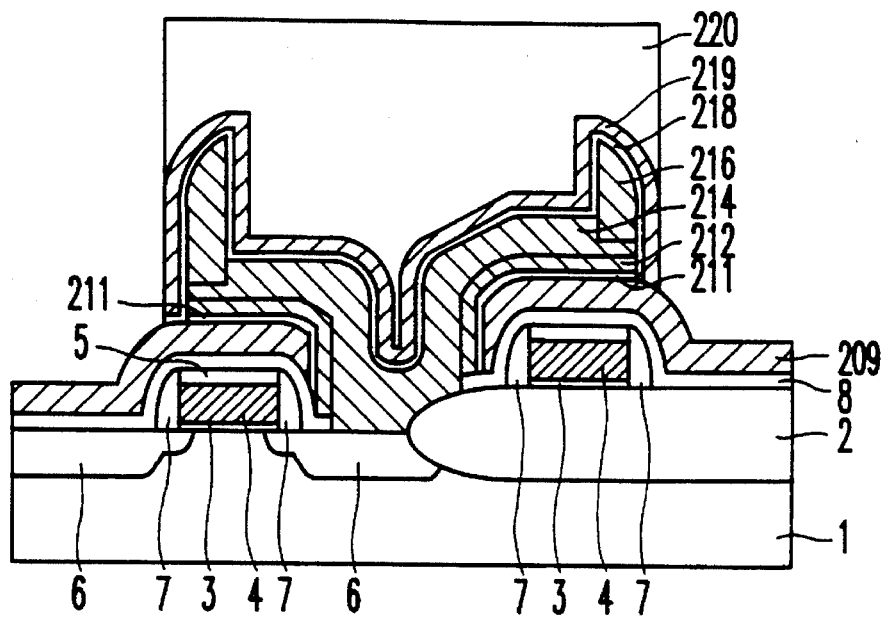

Referring to FIG. 3E, a fourth polysilicon layer 216 is deposited on the entire surface of the resulting structure after etching the third polysilicon layer 214. The fourth polysilicon layer 216, the third polysilicon layer 214 and the second polysilicon layer 212 are etched by a blanket etching process using the CVD oxide layer 215 that is patterned by a lithography process and an anisotropic etching process, thereby forming a fourth polysilicon spacer on the side walls of the CVD oxide layer 215, patterned by a lithography process and an anisotropic etching process, and on the third polysilicon layer 214. The first dielectric layer 211 exposed by a blanket etching process is etched by etching process to expose the first polysilicon layer 209, and the CVD oxide layer 215 is then removed by an isotropic etching process. It is desirable that the third polysilicon layer 214 and the fourth polysilicon layer 216 be removed using the first dielectric layer 211 as an etching barrier to protect against damage to the first polysilicon layer 209. Also, the third polysilicon layer 214 and the fourth polysilicon layer 216 are preferably formed with doped polysilicon in which an impurity is doped. The tow layers act as a charge storage electrode for the capacitor.

Referring to 3F, the second dielectric layer 218 is formed on the entire surface of the resulting structure after removing the CVD oxide layer 215. Therefore, the second dielectric layer 218 connected to the first dielectric layer 211. A fifth polysilicon layer 219 is deposited on the second dielectric layer 218 and a third photoresist pattern 220 is then formed at the center of the fifth polysilicon layer 218. The fifth polysilicon layer 219 and the second dielectric layer 218 exposed by the third photoresist layer are sequentially etched by an etching process, thereby exposing the first polysilicon layer 209. It is desirable that the fifth polysilicon layer 219 be deposited with a thickness of about 100 to 500Å to protect against damage to the second dielectric layer 218 due to the continuity of various processes. Also, the fifth polysilicon layer 219 is preferably formed with undoped polysilicon in which an impurity is not doped.

Figure 3G:
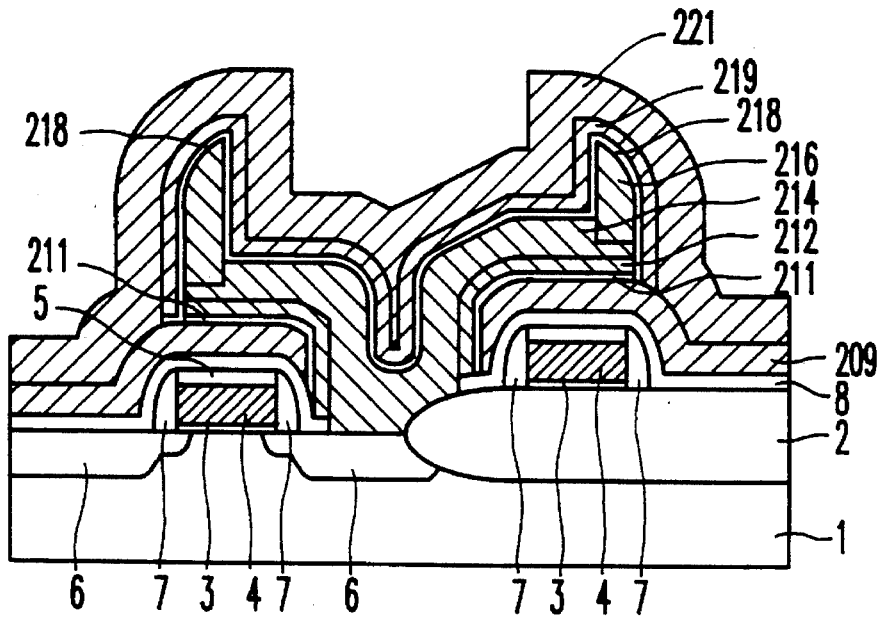

Referring to FIG. 3G, the third photoresist pattern 220 is removed and a sixth polysilicon layer 221 is then deposited on the entire surface of the resulting structure after removing the third photoresist pattern 220 thereby forming a capacitor. It is desirable that the sixth polysilicon layer 221 be formed with doped polysilicon in which an impurity is doped. The sixth polysilicon layer 221 connected to the first polysilicon layer 209 acts as a plate electrode for the capacitor.

As described above, a capacitor according to the present invention increases the capacitance of a stacked capacitor by forming a dielectric layer and a plate electrode under and over a charge storage electrode.

What is claimed is:

1. A method of forming a capacitor in a semiconductor device, comprising the steps of:

sequentially forming an insulating layer and a first polysilicon layer on a silicon substrate having an impurity region;

etching a portion of said first polysilicon layer to expose a portion of said insulating layer;

sequentially depositing a first dielectric layer and a second polysilicon layer on said first polysilicon layer including said insulating layer;

etching a portion of said first dielectric layer, said second polysilicon layer, and said insulating layer to form a contact hole which exposes said impurity region;

forming a third polysilicon layer on the entire surface of resulting structure including said impurity region exposed via said contact hole after forming said contact hole;

patterning said second and third polysilicon layer to expose portions of said first dielectric layer;

depositing a CVD oxide layer on the entire surface of the resulting structure after patterning said second and third polysilicon layers;

etching a portion of said CVD oxide layer to form a groove which exposes said third polysilicon layer;

depositing a fourth polysilicon layer on an entire surface of the resulting structure after forming said groove and filling said groove with the photoresist;

sequentially removing an exposed portion of said fourth polysilicon layer, said CVD oxide layer and said first dielectric layer, and removing said photoresist;

sequentially depositing a second dielectric layer and a fifth polysilicon layer on the entire surface of the resulting structure after removing said photoresist, and etching portions of said fifth polysilicon layer and said second dielectric layer to expose said first polysilicon layer; and depositing a sixth polysilicon layer on the entire surface of the resulting structure after etching said fifth polysilicon layer and said second dielectric layer.

2. The method of claim 1, wherein said insulating layer is formed with nitride.

3. The method of claim 1 or claim 2, wherein said insulating layer acts as an etching barrier while said first polysilicon layer is etched.

4. The method of claim 1, further comprising etching a portion of said first polysilicon layer is etched by a dry-etching method to form an undercut.

5. The method of claim 1 or 4, wherein a portion of said first polysilicon layer is etched by a lithography process and an etching method utilizing a contact mask for a charge storage electrode.

6. The method of claim 1, wherein said first dielectric layer acts as an etching barrier while said third polysilicon layer is patterned.

7. The method of claim 1, wherein said CVD oxide layer is etched by an anisotropic etching process to form said groove.

8. The method of claim 1, wherein said CVD oxide layer is removed by an isotropic etching method in an etching process thereof using said photoresist as a mask.

9. The method of claim 1, wherein said second polysilicon layer and said fifth polysilicon layer are formed with a thickness of 100 to 500Å, respectively, to protect against damage to said first and second dielectric layer.

10. The method of claim 1 or claim 9, wherein said second polysilicon layer and said polysilicon layer are formed with undoped polysilicon, respectively.

11. The method of claim 1, wherein said third polysilicon layer is connected to said fourth polysilicon layer, thereby forming a charge storage electrode.

12. The method of claim 1, wherein said first dielectric layer is connected to said second dielectric layer, thereby forming a dielectric layer for a capacitor.

13. The method of claim 1, wherein said first polysilicon layer is connected to said sixth polysilicon layer, thereby forming a plate electrode.

14. The method of claim 1, wherein said first, third fourth and sixth polysilicon layers are formed with doped polysilicon, respectively.

15. A method of forming a capacitor in a semiconductor device, comprising the steps of:

sequentially forming an insulating layer and a first polysilicon layer on a silicon substrate having an impurity region;

etching a portion of said first polysilicon layer to expose a portion of said insulating layer;

sequentially depositing a first dielectric layer and a second polysilicon layer on said first polysilicon layer including said insulating layer;

etching a portion of said first dielectric layer, said second polysilicon layer, and said insulating layer to expose said impurity region, thereby forming a contact hole;

depositing a third polysilicon layer on the entire surface of the resulting structure including said second polysilicon layer and said impurity region exposed via said contact hole after forming said contact hole;

depositing a CVD oxide layer on said third polysilicon layer and patterning said CVD oxide layer to include a portion of said CVD oxide layer at the center of said third polysilicon layer;

depositing a fourth polysilicon layer on the entire surface of the resulting structure after patterning said CVD oxide layer;

forming a photoresist pattern on said fourth polysilicon layer to expose first, second and third portions of said fourth polysilicon layer;

removing said third polysilicon layer, said fourth polysilicon layer, said CVD oxide layer and said first dielectric layer exposed by said photoresist pattern;

removing said photoresist pattern and sequentially depositing a second dielectric layer and a fifth polysilicon layer on the entire surface of the resulting structure after removing said photoresist pattern;

etching portions of said fifth polysilicon layer and second dielectric layer to expose said first polysilicon layer; and depositing a sixth polysilicon layer on the entire surface of the resulting structure after etching said fifth polysilicon layer and second dielectric layer.

16. The method of claim 15, wherein said insulating layer is formed with nitride.

17. The method of claim 15 or claim 16, wherein said insulating layer acts as an etching barrier while said first polysilicon layer is etched.

18. The method of claim 15, wherein a portion of said first polysilicon layer is etched by a dryetching method to form an undercut.

19. The method of claim 15 or 18 wherein a portion of said first polysilicon layer is etched by a lithography process and an etching process utilizing a contact mask for a charge storage electrode.

20. The method of claim 15, wherein said CVD oxide layer is etched by an anisotropic etching process to pattern said CVD oxide layer.

21. The method of claim 15, comprising the additional steps of etching said third polysilicon layer so that said third polysilicon layer has a thickness of 50 to 500Å after said CVD oxide layer patterning step.

22. The method of claim 15, wherein said third and fourth polysilicon layer is removed by an anisotropic etching process and said CVD oxide layer is removed by an isotropic etching process during the etching process using said photoresist pattern as a mask.

23. The method of claim 15 or 22, wherein said first dielectric layer acts as an etching barrier during the etching process using said photoresist pattern as a mask.

24. The method of claim 15, wherein said second polysilicon layer and said fifth polysilicon layer are formed with a thickness of 100 500Å, respectively, to protect against damage to said first and second dielectric layer.

25. The method of claim 15 or 24, wherein said second and fifth polysilicon layer are formed with undoped polysilicon.

26. The method of claim 15, wherein said third polysilicon layer is connected to said fourth polysilicon layer, thereby forming a charge storage electrode.

27. The method of claim 15, wherein said first dielectric layer is connected to said second dielectric layer.

28. The method of claim 15, wherein said first polysilicon layer is connected to said sixth polysilicon layer, thereby forming a plate electrode.

29. The method of claim 15, wherein said first, third, fourth and sixth polysilicon layers are formed with doped polysilicon.

30. A method of forming a capacitor in a semiconductor device, comprising the steps of:

sequentially forming an insulating layer and a first polysilicon layer on a silicon substrate having an impurity region;

etching a portion of said first polysilicon layer to expose a portion of said insulating layer;

sequentially depositing a first dielectric layer and a second polysilicon layer on said first polysilicon layer including said insulating layer;

etching a portion of said first dielectric layer, said second polysilicon layer, and said insulating layer to expose said impurity region via a contact hole;

depositing a third polysilicon layer on the entire surface of the resulting structure including said impurity region exposed by said contact hole, after forming said contact hole;

depositing a CVD oxide layer on said third polysilicon layer and patterning said CVD oxide layer to retain a portion of said CVD oxide layer at the center of said third polysilicon layer;

depositing a fourth polysilicon layer on the entire surface of the resulting structure after patterning said CVD oxide layer, and etching said third and fourth polysilicon layers exposed by patterning said CVD oxide layer to expose said first dielectric layer, thereby forming a fourth polysilicon spacer on the side walls of said CVD oxide layer;

removing said first dielectric layer exposed by etching said third and fourth polysilicon layers to expose said first polysilicon layer and thereafter removing said CVD oxide layer;

sequentially depositing a second dielectric layer and a fifth polysilicon layer on the entire surface of the resulting structure after removing said CVD oxide layer, and etching portions of said fifth polysilicon layer and second dielectric layer to expose said first polysilicon layer; and depositing a sixth polysilicon layer on the entire surface of the resulting structure after said fifth polysilicon layer and second dielectric layer.

31. The method of claim 30, wherein said insulating layer is formed with nitride.

32. The method of claim 30 or claim 31, wherein said insulating layer acts as an etching barrier while said first polysilicon layer is etched.

33. The method of claim 30, wherein a portion of said first polysilicon layer is etched by a dryetching process to undercut.

34. The method of claim 31 or 33, wherein a portion of said first polysilicon layer is etched by a lithography process and an etching process utilizing a contact mask for a charge storage electrode.

35. The method of claim 30, wherein said CVD oxide layer is etched by an anisotropic etching process in said CVD oxide layer patterning step.

36. The method of claim 30, comprising the additional steps of etching said third polysilicon layer so that said third polysilicon layer has a thickness of 50 to 500Å after said CVD oxide layer patterning step.

37. The method of claim 30, wherein said fourth polysilicon spacer is formed by a blanket etching process.

38. The method of claim 30, wherein said first dielectric layer acts as an etching barrier during the formation of said fourth polysilicon spacer.

39. The method of claim 30, wherein said CVD oxide layer is removed by an isotropic etching process during said CVD oxide layer removing step.

40. The method of claim 30, wherein said second polysilicon layer and said fifth polysilicon layer are formed with a thickness of 100 to 500Å, respectively, to protect against damage to said first and second dielectric layers.

41. The method of claim 30, wherein said second polysilicon layer and said fifth polysilicon layer are formed with undoped polysilicon.

42. The method of claim 30, wherein said second polysilicon layer is connected to said fourth polysilicon layer, thereby forming a charge storage electrode.

43. The method of claim 30, wherein said first dielectric layer is connected to said second dielectric layer.

44. The method of claim 30, wherein said first polysilicon layer is connected to said sixth polysilicon layer, thereby forming a plate electrode.

45. The method of claim 30, wherein said first, third, fourth and sixth polysilicon layers are formed with doped polysilicon

* * * * *